(12) United States Patent
Kim et al.

(10) Patent No.: US 10,304,870 B2
(45) Date of Patent: May 28, 2019

(54) MIRROR DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Kyung-Ho Kim, Seoul (KR); Jin-Hyun Park, Yongin-si (KR); Young-Woo Song, Suwon-si (KR); Jun-Ho Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 128 days.

(21) Appl. No.: 15/210,443

(22) Filed: Jul. 14, 2016

(65) Prior Publication Data

US 2017/0069808 A1 Mar. 9, 2017

(30) Foreign Application Priority Data

Sep. 7, 2015 (KR) ........................ 10-2015-0126024

(51) Int. Cl.
*H01L 27/12* (2006.01)
*H01L 51/52* (2006.01)
*H01L 27/14* (2006.01)

(52) U.S. Cl.
CPC ...... *H01L 27/1248* (2013.01); *H01L 51/5246* (2013.01); *H01L 51/5271* (2013.01); *H01L 51/5275* (2013.01); *H01L 51/5256* (2013.01); *H01L 2227/323* (2013.01)

(58) Field of Classification Search
CPC ...... H01L 33/60; H01L 27/1248; H01L 33/54
See application file for complete search history.

(56) References Cited

U.S. PATENT DOCUMENTS

| 2008/0157065 A1* | 7/2008 | Krishnamoorthy | C09D 183/04 257/40 |
| 2010/0090595 A1* | 4/2010 | Nomura | B29D 11/00596 313/506 |
| 2013/0242212 A1* | 9/2013 | Huang | H01L 51/5271 349/15 |

FOREIGN PATENT DOCUMENTS

| KR | 1020090099744 A | 9/2009 |
| KR | 1020160069627 A | 6/2016 |

* cited by examiner

*Primary Examiner* — Elias Ullah
(74) *Attorney, Agent, or Firm* — Cantor Colburn LLP

(57) ABSTRACT

A mirror display apparatus includes a display unit, a thin film encapsulation layer, a plurality of mirror patterns, a protection layer and a refractive index matching layer. The display unit is disposed on a substrate. The thin film encapsulation layer extends continuously on a surface of the display unit. The mirror patterns are arranged on the thin film encapsulation layer. The protection layer is disposed on surfaces of the mirror patterns. The refractive index matching layer is interposed between the thin film encapsulation layer and the protection layer, and the refractive index matching layer fills regions between neighboring ones of the mirror patterns. A refractive index of the refractive index matching layer is less than a refractive index of the thin film encapsulation layer, and the refractive index of the refractive index matching layer is greater than a refractive index of the protection layer.

12 Claims, 11 Drawing Sheets

MIRROR DISPLAY APPARATUS AND METHOD OF MANUFACTURING THE SAME

This application claims priority to Korean Patent Application No. 10-2015-0126024, filed on Sep. 7, 2015, and all the benefits accruing therefrom under 35 U.S.C. § 119, the content of which in its entirety is herein incorporated by reference.

BACKGROUND

1. Field

Exemplary embodiments relate to a mirror display apparatus. More particularly, exemplary embodiments relate to a mirror display apparatus including a plurality of mirror patterns and a method of manufacturing the mirror display apparatus.

2. Description of the Related Art

Recently, a display apparatus, e.g., an organic light emitting display ("OLED") apparatus or a liquid crystal display ("LCD") apparatus having a mirror property together with an image display property has been researched.

Layer structures or patterns having a reflective property may be inserted into the display device to realize the mirror property. However, a manufacturing process or a display quality may be affected adversely due to an implementation of the mirror property.

SUMMARY

In a conventional display apparatus having a mirror property, a light emitting efficiency and the display quality thereof may decrease due to an air gap between the patterns having the reflective property.

Exemplary embodiments provide a mirror display apparatus having an improved display quality.

Exemplary embodiments provide a method of manufacturing a mirror display apparatus having an improved display quality.

According to exemplary embodiments, a mirror display apparatus includes a display unit, a thin film encapsulation layer, a plurality of mirror patterns, a protection layer and a refractive index matching layer. The display unit is disposed on a substrate. The thin film encapsulation layer extends continuously on a surface of the display unit. The mirror patterns are disposed on the thin film encapsulation layer. The protection layer is disposed on surfaces of the mirror patterns. The refractive index matching layer is interposed between the thin film encapsulation layer and the protection layer, and regions between neighboring ones of the mirror patterns are filled with the refractive index matching layer.

In exemplary embodiments, a refractive index of the refractive index matching layer is less than a refractive index of the thin film encapsulation layer, and the refractive index of the refractive index matching layer is greater than a refractive index of the protection layer.

In exemplary embodiments, the refractive index matching layer may include an acrylic or a silicon.

In exemplary embodiments, the protection layer may include a glass or a polymer film.

In exemplary embodiments, the protection layer may include first and second protection layers, which are sequentially disposed on the surfaces of the mirror patterns. The refractive index of the refractive index matching layer may be greater than a refractive index of the first protection layer.

In exemplary embodiments, the first protection layer may include a glass, and the second protection layer may include a polymer film.

In exemplary embodiments, the refractive index matching layer may be disposed on the surfaces of the mirror patterns and on a top surface of the thin film encapsulation layer exposed by the mirror patterns.

In exemplary embodiments, the refractive index matching layer may include an adhesive material.

In exemplary embodiments, the thin film encapsulation layer may include at least one inorganic layer and at least one organic layer. In such embodiments, a refractive index of the refractive index matching layer may be less than a refractive index of an uppermost layer of the thin film encapsulation layer.

In exemplary embodiments, the thin film encapsulation layer may include a plurality of inorganic layers or a plurality of organic layers. In such embodiments, a refractive index of the refractive index matching layer may be less than a refractive index of an uppermost inorganic layer or an uppermost organic layer.

In exemplary embodiments, the display unit may include an emitting region and a non-emitting region. In such embodiments, the emitting region may overlap a portion of the refractive index matching layer between neighboring ones of the mirror patterns. The non-emitting region may overlap the mirror patterns.

According to exemplary embodiments, a method of manufacturing a mirror display apparatus includes providing a display unit on a substrate; providing a thin film encapsulation layer extending continuously on a surface of the display unit; providing a plurality of mirror patterns on the thin film encapsulation layer; providing a refractive index matching layer on the mirror pattern to fill regions between neighboring ones of the mirror patterns; and providing a protection layer on the refractive index matching layer. In such embodiments, a refractive index of the refractive index matching layer is less than a refractive index of the thin film encapsulation layer, and the refractive index of the refractive index matching layer is greater than a refractive index of the protection layer.

In exemplary embodiments, the refractive index matching layer may include an acrylic or a silicon.

In exemplary embodiments, the protection layer may include a glass or a polymer film.

In exemplary embodiments, in a formation of the protection layer, first and second protection layers may be formed on surfaces of the mirror patterns. The refractive index of the refractive index matching layer may be greater than a refractive index of the first protection layer.

In exemplary embodiments, the first protection layer may include a glass, and the second protection layer may include a polymer film.

In exemplary embodiments, the refractive index matching layer may be disposed on surfaces of the mirror patterns and on a top surface of the thin film encapsulation layer exposed by the mirror patterns.

In exemplary embodiments, the providing the refractive index matching layer and the protection layer may include: providing an adhesive layer on the protection layer; arranging the protection layer in a way such that the adhesive layer faces the thin film capsulation layer, and the protection layer is coupled to the thin film encapsulation layer with the adhesive layer; and performing a thermal compression process to the adhesive layer to transform the adhesive layer into the refractive index matching layer.

In exemplary embodiments, the thin film encapsulation layer may include at least one inorganic layer and at least one organic layer. In such embodiments, a refractive index of the refractive index matching layer may be less than a refractive index of an uppermost layer of the thin film encapsulation layer.

In exemplary embodiments, the thin film encapsulation layer may include a plurality of inorganic layers or a plurality of organic layers. In such embodiments, a refractive index of the refractive index matching layer may be less than a refractive index of an uppermost inorganic layer or an uppermost organic layer.

In exemplary embodiments, the display unit may include an emitting region and a non-emitting region. In such embodiments, the emitting region may overlap a portion of the refractive index matching layer between neighboring ones of the mirror patterns, and the non-emitting region may overlap the mirror patterns.

The mirror display apparatus in accordance with exemplary embodiments includes a refractive index matching layer filling regions between neighboring ones of mirror patterns. In such an embodiment, a refractive index of the refractive index matching layer may be less than a refractive index of a thin film encapsulation layer and may be greater than a refractive index of a protection layer.

Accordingly, in such embodiment, an gap at the regions between neighboring ones of the mirror patterns, which is typically filled with air in a conventional mirror display apparatus, may be filled with the refractive index matching layer, such that a light emitting efficiency of the mirror display apparatus may be enhanced.

In such embodiments, the refractive index matching layer may serve as a planarization layer and an additional protection layer to protect the mirror patterns from subsequent processes.

BRIEF DESCRIPTION OF THE DRAWINGS

Exemplary embodiments will be more clearly understood from the following detailed description taken in conjunction with the accompanying drawings.

DETAILED DESCRIPTION OF THE EMBODIMENTS

Figure 1:
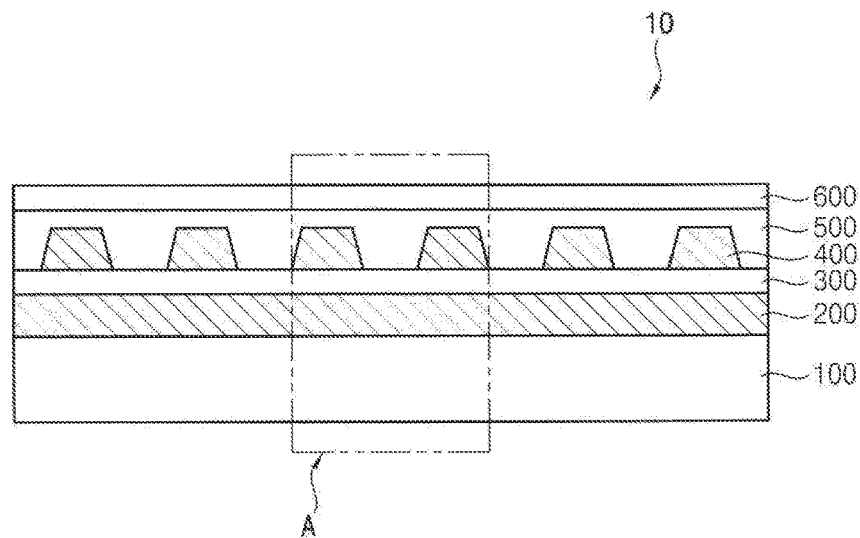
FIG. 1 is a cross-sectional view illustrating a mirror display apparatus in accordance with exemplary embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
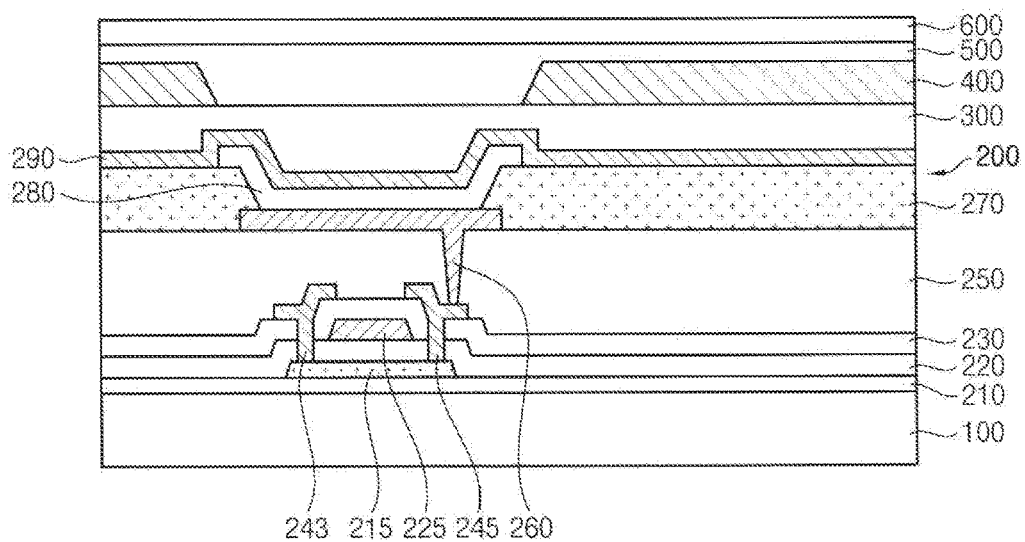
FIG. 2 is an enlarged view of region A of FIG. 1.

FIG. 1 is a cross-sectional view illustrating a mirror display apparatus in accordance with exemplary embodiments. FIG. 2 is an enlarged view of region A of FIG. 1.

Referring to FIGS. 1 and 2, a mirror display apparatus 10 may include a display unit 200 disposed or arranged on a substrate 100, a thin film encapsulation (TFE) layer 300 continuously extending on a surface of the display unit 200, a plurality of mirror patterns 400 disposed or arranged on the thin film encapsulation layer 300, a refractive index matching layer 500 filling, or disposed inside, regions between neighboring ones of the mirror patterns 400, and a protection layer 600 disposed on the refractive index matching layer 500.

The substrate 100 may include, e.g., a glass substrate, a transparent plastic substrate or a flexible plastic substrate. The substrate 100 may support the display unit 200, etc.

The display unit 200 may include a switching device on the substrate 100 and a display structure electrically connected to the switching device.

In an exemplary embodiment, as shown in FIG. 2, the switching device may include, e.g., a thin film transistor ("TFT") including an active pattern 215, a gate insulation layer 220, a gate electrode 225, a source electrode 243 and a drain electrode 245. The display structure may include, e.g., a first electrode 260, a display layer 280 and the second electrode 290.

A barrier layer 210 may be disposed on an upper surface of the substrate 100 such that moistures penetrating through the substrate 100 may be blocked by the barrier layer 210, and impurity diffusion between the substrate 100 and structures thereon may be also blocked by the barrier layer 210.

In one exemplary embodiment, for example, the barrier layer 210 may include silicon oxide, silicon nitride, or silicon oxynitride. These materials may be used alone or in a combination thereof. In an embodiment, the barrier layer 210 may have a multi-layer structure including a silicon oxide layer and a silicon nitride layer.

The active pattern 215 may include a silicon compound such as polysilicon. In some embodiments, the active pattern 215 may include an oxide semiconductor such as indium gallium zinc oxide ("IGZO"), zinc tin oxide ("ZTO"), or indium tin zinc oxide ("ITZO"). In one exemplary embodiment, for example, an active layer including the silicon compound or the oxide semiconductor may be formed by a sputtering process, and then may be patterned by a photolithography process.

The gate insulation layer 220 may be disposed on the barrier layer 210, and cover the active pattern 215. The gate insulation layer 220 may include silicon oxide, silicon nitride and/or silicon oxynitride. The gate insulation layer 220 may have a multi-layer structure including a silicon oxide layer and a silicon nitride layer.

The gate electrode 225 may be formed on the gate insulation layer 220, and may be superimposed over the active pattern 215. In one exemplary embodiment, for example, a first conductive layer may be formed on the gate insulation layer 220, and may be patterned by a photolithography process to form the gate electrode 225. The first conductive layer may include or be formed of at least one metal selected from Al, Ag, W, Cu, Mo, Ti, Ta, Cr, etc. and a nitride thereof, for example, by a sputtering process or an atomic layer deposition ("ALD") process. The first conductive layer may have a multi-layer structure such as an Al/Mo structure or a Ti/Cu structure.

In some embodiments, a scan line may include or be formed from the first conductive layer. The gate electrode 225 may be defined by a portion diverged from the scan line.

In some embodiments, an ion-implantation process may be performed using the gate electrode 225 as an implantation mask such that a source region and a drain region may be formed at both ends of the active pattern 215. A portion of the active pattern 215 between the source and drain regions, which may overlap the gate electrode 225, may be defined as a channel region through which a charge may be mover or transferred.

An insulating interlayer 230 may be disposed on the gate insulation layer 220, and may cover the gate electrode 225. The insulating interlayer 230 may include silicon oxide, silicon nitride and/or silicon oxynitride. The insulating interlayer 230 may have a multi-layer structure including a silicon oxide layer and a silicon nitride layer.

The source electrode 243 and the drain electrode 245 may extend through the insulating interlayer 230 and the gate insulation layer 220 to be in contact with the active pattern 215. The source electrode 243 and the drain electrode 245 may be in contact with the source region and the drain region, respectively, of the active pattern 215.

In one exemplary embodiment, for example, the insulating interlayer 230 and the gate insulation layer 220 may be partially etched to form contact holes therein through which the active pattern 215 may be exposed. A second conductive layer may be disposed on the insulating interlayer 230 to fill the contact holes, and may be patterned by a photo-lithography process to form the source electrode 243 and the drain electrode 245. The second conductive layer may include or be formed from a material and a process substantially the same as or similar to those for the first conductive layer.

In some embodiments, a data line may include or be formed from the second conductive layer. In such an embodiment, the source electrode 243 may be defined by a portion diverged from the data line.

The TFT may be provided or formed in each pixel of the display unit 200 by the processes as described above. In some embodiments, at least two TFTs and a capacitor may be provided in the each pixel.

A via insulation layer 250 may be disposed on the insulating interlayer 230, and may cover the source and drain electrodes 243 and 245. The via insulation layer 250 may be formed using an organic material such as polyimide, an epoxy resin, an acrylate-based resin, or polyester by a spin coating process or a slit coating process. The via insulation layer 250 may also serve as a planarization layer of the display unit 200.

The display structure may be disposed on the via insulation layer 250.

The first electrode 260 may extend through the via insulation layer 250, and may be electrically connected to the drain electrode 245. In one exemplary embodiment, for example, the via insulation layer 250 may be partially etched to form a via hole therein through which the drain electrode 245 may be exposed. A third conductive layer may be formed on the via insulation layer to substantially fill the via hole, and may be patterned by a photo-lithography process to form the first electrode 260.

The first electrode 260 may serve as an anode or a pixel electrode of the display unit 200, and may be provided in each pixel in the display unit 200.

The third conductive layer may include or be formed from a material and a process substantially the same as or similar to those for the first conductive layer. In some embodiments, the third conductive layer may include or be formed of a transparent conductive layer such as indium tin oxide ("ITO"), indium zinc oxide ("IZO"), zinc oxide, indium oxide, etc.

A pixel defining layer ("PDL") 270 may be disposed on the via insulation layer 250 to cover a peripheral portion of the first electrode 260. In one exemplary embodiment, for example, the PDL 270 may be formed using a photosensitive organic material by exposure and developing processes. Alternatively, the PDL 270 may be formed of a silicon-based inorganic material by a photo-lithography process.

In exemplary embodiments, an area of the first electrode 260 exposed by the PDL 270 may substantially correspond to an emitting region of each pixel.

The display layer 280 may be disposed on the first electrode 260 and the PDL 270. In exemplary embodiments, the display layer 280 may include an organic light emitting material, and the display device may be provided as an organic light emitting display ("OLED") device. In such an embodiment, the display layer 280 may further include a hole transport layer ("HTL") and an electron transport layer ("ETL") which are disposed under and on the display layer 280, respectively.

The display layer 280 may be formed by individually printing the organic light emitting material at each pixel. The HTL and the ETL may be formed at each pixel, or may be formed commonly or simultaneously at a plurality of the pixels.

In some alternative embodiments, the display layer 280 may include a liquid crystal material. In such an embodiment, the display device may be provided as a liquid crystal display ("LCD") device.

The second electrode 280 may be disposed on the PDL 270 and the display layer 280. In some embodiments, the second electrode 280 may serve as a common electrode on the plurality of the pixels. The second electrode 290 may also serve as a cathode of the display unit 200.

The second electrode 290 may be formed by a depositing a metal or a transparent conductive material as mentioned above through, e.g., an open mask.

The thin film encapsulation layer 300 may seal the display unit 200 to protect the display unit 200. In one exemplary embodiment, for example, the thin film encapsulation layer 300 may extend continuously on the surface of the display unit 200.

In some exemplary embodiments, the thin film encapsulation layer 300 may include at least one inorganic layer and at least one organic layer (not shown). For example, the thin film encapsulation layer 300 layer may be provided by stacking (e.g., sequentially stacking) a first inorganic layer, an organic layer, and a second inorganic layer. However, the invention is not limited thereto, and the thin film encapsulation layer 300 may be provided by stacking (e.g., sequentially stacking) a first inorganic layer, a first organic layer, a second inorganic layer, a second organic layer and a third inorganic layer.

Alternatively, the thin film encapsulation layer 300 may include a plurality of organic layers (not shown). Alternatively, the thin film encapsulation layer 300 may include a plurality of or inorganic layers (not shown).

Each of the organic layers may include polymer organic compound such as epoxy, acrylate and urethane acrylate.

Each of the inorganic layers may include metal oxide, metal nitride or a combination thereof. In one exemplary embodiment, for example, each of the inorganic layers may include aluminum oxide, silicon oxide or silicon nitride.

Alternatively, the thin film encapsulation layer 300 may include the organics layers and the inorganic layers repeatedly stacked one on another.

A refractive index of the thin film encapsulation layer 300 may be greater than a refractive index of the refractive index matching layer 500 which will be described later in detail.

The mirror patterns 400 may be disposed on the thin film encapsulation layer 300. In one exemplary embodiment, for example, the mirror patterns 400 may be disposed or arranged in, e.g., a grid shape, a line shape, a mesh shape, or a plurality of islands shape.

The mirror patterns 400 may include a material having a high reflectivity. In exemplary embodiments, the mirror patterns 400 may include at least one metal selected from aluminum (Al), chromium (Cr), copper (Cu), silver (Ag), titanium (Ti), tantalum (Ta), molybdenum (Mo) and tungsten (W), for example, but not limited thereto. The mirror patterns 400 may have a single metal layer structure. In some embodiments, the mirror patterns 400 may have a multi metal layer structure, e.g., a double-layer structure or a triple-layer structure which includes a plurality of different metal layers.

The mirror patterns 400 may overlap a region except for an emitting region among the pixel region (e.g., a non-emitting region). In such an embodiment, an area between the neighboring mirror patterns 400 may overlap the emitting region of the pixel region in the display apparatus.

In an exemplary embodiment, the refractive index matching layer 500 may fill a region between neighboring ones of the mirror patterns 400. In one exemplary embodiment, for example, the refractive index matching layer 500 may be disposed on surfaces of the mirror patterns 400 and a top surface of the thin film encapsulation layer 300.

In such an embodiment, the refractive index matching layer 500 may cover the mirror patterns 400 and the top surface of the thin film encapsulation layer 300 exposed by the mirror patterns 400.

In exemplary embodiments, the refractive index matching layer 500 may include an adhesive material.

The refractive index of the refractive index matching layer 500 may be less than the refractive index of the thin film encapsulation layer 300 and may be greater than a refractive index of the protection layer 600, which will be described later in detail.

In one exemplary embodiment, for example, the refractive index matching layer 500 may include an acryl or a silicon.

In an exemplary embodiment, the protection layer 600 may be disposed on the refractive index matching layer 500. In such an embodiment, the refractive index of the protection layer 600 may be less than the refractive index of the refractive index matching layer 500. In one exemplary embodiment, for example, the protection layer 600 may include a glass or a polymer film.

The mirror display apparatus 10 in accordance with exemplary embodiments includes the refractive index matching layer 500 filling regions between neighboring ones of mirror patterns 400. The refractive index of the refractive index matching layer 500 may be less than the refractive index of the thin film encapsulation layer 300 and may be greater than the refractive index of the protection layer 600.

Accordingly, in such an embodiment, a gap at the region between neighboring ones of the mirror patterns 400, which is typically filled with air in a conventional mirror display apparatus, may be filled with the refractive index matching layer 500, such that a light emitting efficiency of the mirror display apparatus 10 may be enhanced.

In such an embodiment, the refractive index matching layer 500 may serve as a planarization layer and an additional protection layer to protect the mirror patterns 400 from subsequent processes.

Hereinafter, a method of manufacturing a mirror display apparatus according to exemplary embodiments will be described in detail.

FIGS. 3 to 6 are cross-sectional views illustrating a method of manufacturing a mirror display apparatus in accordance with exemplary embodiments.

Figure 3:
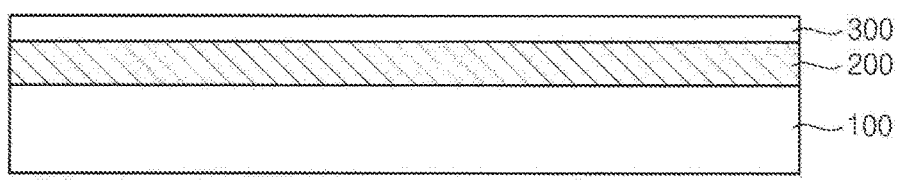
FIGS. 3 to 6 are cross-sectional views illustrating a method of manufacturing a mirror display apparatus in accordance with exemplary embodiments.

Referring to FIGS. 2 and 3, a display unit 200 and a thin film encapsulation layer 300 extending continuously on a surface of the display unit 200 may be provided or formed on a substrate 200

The substrate 100 may include a glass substrate, a transparent plastic substrate, or a flexible plastic substrate. The substrate 100 may support the display unit 200, etc.

The display unit 200 may include a switching element provided on the substrate 100 and a display structure electrically connected to the switching element.

The switching element may include a thin film transistor including an active pattern 215, a gate insulation layer 220, a gate electrode 225, a source electrode 243 and a drain electrode 245. The display structure may include a first electrode 260, a light emitting layer 280 and a second electrode 290.

The thin film encapsulation layer 300 may be formed to seal the display unit 200 and to protect the display unit 200. In one exemplary embodiment, for example, the thin film encapsulation layer 300 may be formed to extend continuously on the surface of the display unit 200.

The thin film encapsulation layer 300 may include at least one inorganic layer and at least one organic layer (not shown) that are sequentially stacked. For example, the thin film encapsulation layer 300 may include organics layers and inorganic layers repeatedly stacked on each other. Alternatively, the thin film encapsulation layer 300 may include a plurality of organic layers (not shown). Alternatively, the thin film encapsulation layer 300 may include a plurality of or inorganic layers (not shown). Alternatively, the thin film encapsulation layer 300 may include the organics layers and the inorganic layers repeatedly stacked on each other.

In such an embodiment, a refractive index of the thin film encapsulation layer 300 may be greater than a refractive index of the refractive index matching layer 500 as described above. For example, the thin film encapsulation layer 300 may include a plurality of layers including at least one inorganic layer and/or at least one organic layer. When the thin film encapsulation layer 300 includes the plurality of layers, a refractive index of an uppermost layer (e.g., a layer nearest to the refractive index matching layer 500) of the thin film encapsulation layer 300 may be greater than the refractive index of the refractive index matching layer 500.

Figure 4:
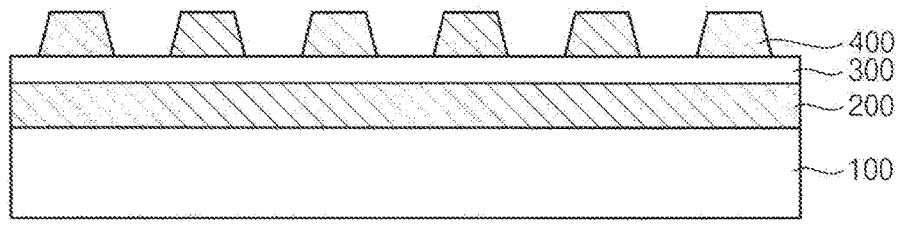

Referring to FIG. 4, a plurality of mirror patterns 400 may be provided or formed on the thin film encapsulation layer 300.

In one exemplary embodiment, for example, a metal layer (not shown) may be formed on the thin film encapsulation layer 300. The metal layer may be patterned to form the mirror patterns 400.

The metal layer may be formed of, e.g., at least one selected from Al, Cr, Cu, Ag, Ti, Ta, Mo, W, and the like. These materials may be used alone or in a combination thereof. The metal layer 105 may be formed by, e.g., a sputtering process, a physical vapor deposition ("PVD") process, an ALD process, a chemical vapor deposition ("CVD") process, etc.

In one exemplary embodiment, for example, the metal layer may be patterned by, e.g., a photo-lithography process to form mirror patterns 400.

In one exemplary embodiment, for example, the mirror patterns 400 may be formed in a grid arrangement, a mesh arrangement or an arrangement including a plurality of islands through the thin film encapsulation layer 300.

Figure 5:
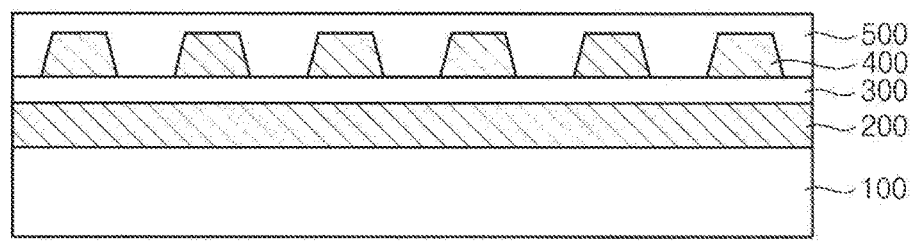

Referring to FIG. 5, a refractive index matching layer 500 may be formed to fill regions between neighboring ones of the mirror patterns 400.

In one exemplary embodiment, for example, the refractive index matching layer 500 may be disposed on surfaces of the mirror patterns 400 and a top surface of the thin film encapsulation layer 300.

In such an embodiment, as shown in FIG. 5, the refractive index matching layer 500 may cover the mirror patterns 400 and the top surface of the thin film encapsulation layer 300 exposed by the mirror patterns 400.

In one exemplary embodiment, for example, the refractive index matching layer 500 may be formed by performing a PVD process, an ALD process, a CVD process, etc.

Figure 6:
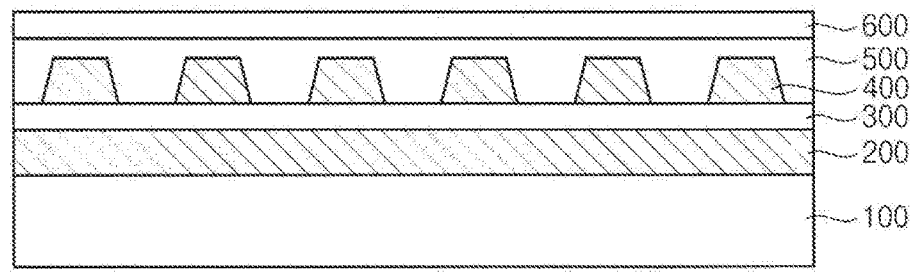

Referring to FIG. 6, the protection layer 600 may be provided or formed on the refractive index matching layer 500.

The refractive index of the protection layer 600 may be less than the refractive index of the refractive index matching layer 500. For example, the protection layer 600 may include a plurality of layers. When the protection layer 600 includes the plurality of layers, a refractive index of a lowermost layer (e.g., a layer nearest to the refractive index matching layer 500) of the protection layer 600 may be less than the refractive index of the refractive index matching layer 500.

In one exemplary embodiment, for example, the protection layer 600 may include a glass or a polymer film.

In an alternative exemplary embodiment, the protection layer 600 may be coupled, e.g., attached or adhered, to the refractive index matching layer 500 through an adhesive layer (not shown).

FIGS. 7 to 11 are cross-sectional views illustrating a method of manufacturing a mirror display apparatus in accordance with exemplary embodiments. The processes and materials of the method shown in FIGS. 7 to 11 are substantially the same as or similar to those illustrated above with reference to FIGS. 3 to 6 except for forming an adhesive layer. The same or like elements shown in FIGS. 7 to 11 have been labeled with the same reference characters as used above to describe the exemplary embodiments of the method shown in FIGS. 3 to 6, and any repetitive detailed description thereof will hereinafter be omitted or simplified.

Figure 7:
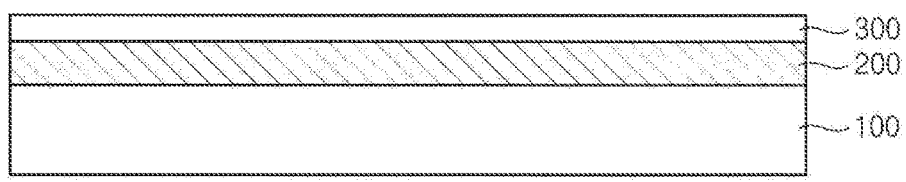
FIGS. 7 to 11 are cross-sectional views illustrating a method of manufacturing a mirror display apparatus in accordance with exemplary embodiments.

Referring to FIGS. 7 and 2, a display unit 200 and a thin film encapsulation layer 300 extending continuously on a surface of the display unit 200 may be formed on a substrate 200.

The substrate 100 may include a glass substrate, a transparent plastic substrate, or a flexible plastic substrate. The substrate 100 may support the display unit 200, etc.

The display unit 200 may include a switching element provided on the substrate 100 and a display structure electrically connected to the switching element.

The thin film encapsulation layer 300 may be formed to seal the display unit 200 and to protect the display unit 200. In one exemplary embodiment, for example, the thin film encapsulation layer 300 may be formed to extend continuously on the surface of the display unit 200.

A refractive index of the thin film encapsulation layer 300 may be greater than a refractive index of the refractive index matching layer 500 as described above. For example, when the thin film encapsulation layer 300 includes a plurality of layers, a refractive index of an uppermost layer of the thin film encapsulation layer 300 may be greater than the refractive index of the refractive index matching layer 500.

Figure 8:
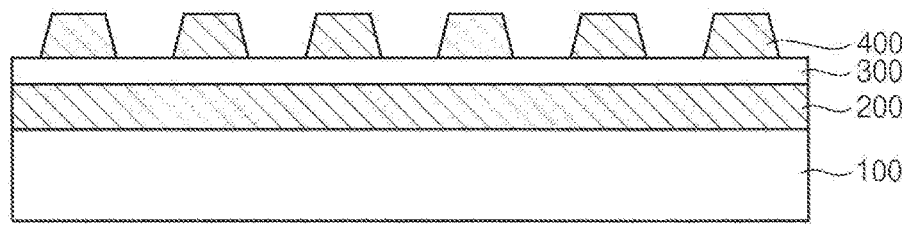

Referring to FIG. 8, a plurality of mirror patterns 400 may be provided or formed on the thin film encapsulation layer 300.

In one exemplary embodiment, for example, a metal layer (not shown) may be formed on the thin film encapsulation layer 300. The metal layer may be patterned to form the mirror patterns 400.

In one exemplary embodiment, for example, the mirror patterns 400 may be formed in a grid arrangement, a mesh arrangement or an arrangement including a plurality of islands through the thin film encapsulation layer 300.

Figure 9:
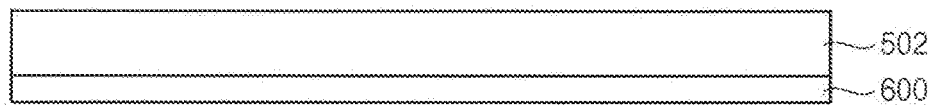

Referring to FIG. 9, an adhesive layer 502 having a viscosity may be provided or formed on a protection layer 600.

In one exemplary embodiment, for example, the protection layer 600 may include a glass or a polymer film.

The adhesive layer 502 may be formed by a spin coating process or a slit coating process on the protection layer 600. The adhesive layer 502 may include an acryl or a silicon. In such an embodiment, a refractive index of the adhesive layer 502 may be less than a refractive index of the thin film encapsulation layer 300 and may be greater than a refractive index of the protection layer 600. For example, when the thin film encapsulation layer 300 includes a plurality of layers, the refractive index of the adhesive layer 502 may be less than a refractive index of an uppermost layer of the thin film encapsulation layer 300. For example, when the protection layer 600 includes a plurality of layers, the refractive index of the adhesive layer 502 may be greater than a refractive index of a lowermost layer of the protection layer 600.

Figure 10:
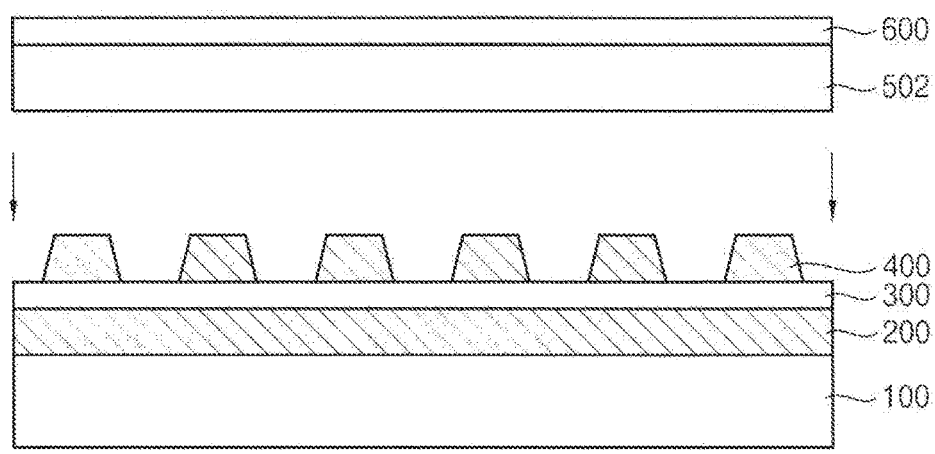
Figure 11:
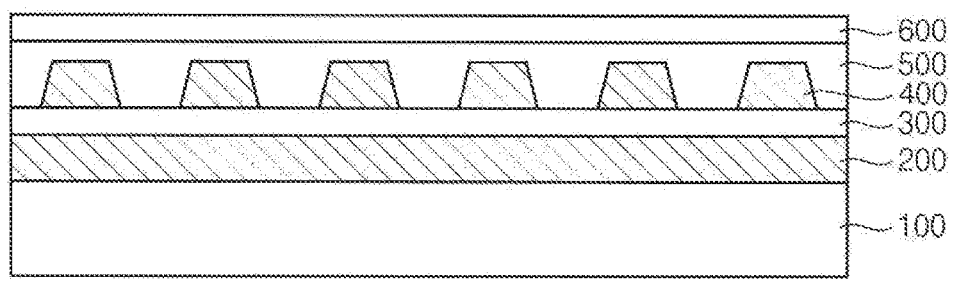

Referring to FIGS. 10 and 11, the protection layer 600 may be arranged upside down such that the adhesive layer 502 faces the mirror patterns 400 and the protection layer 600 adheres to the mirror patterns 400. In such an embodiment, a thermal compression process may be performed to the adhesive layer 502. By the thermal compression process, the adhesive layer 502 may be transformed into a refractive index matching layer 500.

A refractive index matching layer 500 may be provided or formed to fill regions between neighboring ones of the mirror patterns 400.

In one exemplary embodiment, for example, the refractive index matching layer 500 may be disposed on surfaces of the mirror patterns 400 and a top surface of the thin film encapsulation layer 300.

In such an embodiment, the refractive index matching layer 500 may cover the mirror patterns 400 and the top surface of the thin film encapsulation layer 300 exposed by the mirror patterns 400.

A refractive index of the refractive index matching layer 500 may be less than the refractive index of the thin film encapsulation layer 300 and may be greater than the refractive index of the protection layer 600. For example, when the thin film encapsulation layer 300 includes a plurality of layers, the refractive index of the refractive index matching layer 500 may be less than a refractive index of an uppermost layer of the thin film encapsulation layer 300. For example, when the protection layer 600 includes a plurality of layers, the refractive index of the refractive index matching layer 500 may be greater than a refractive index of a lowermost layer of the protection layer 600.

Figure 12:
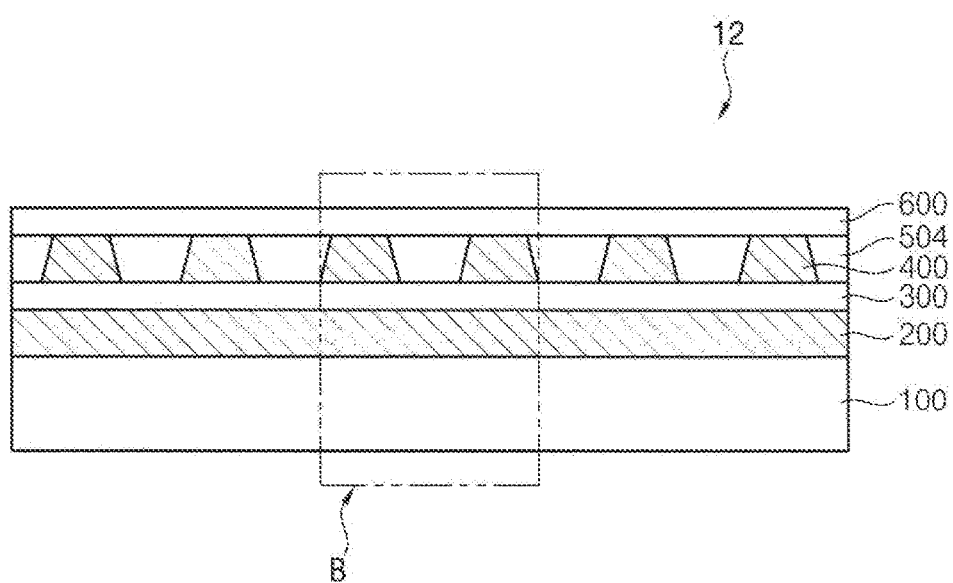
FIG. 12 is a cross-sectional view illustrating a mirror display apparatus in accordance with exemplary embodiments.
Figure 13:
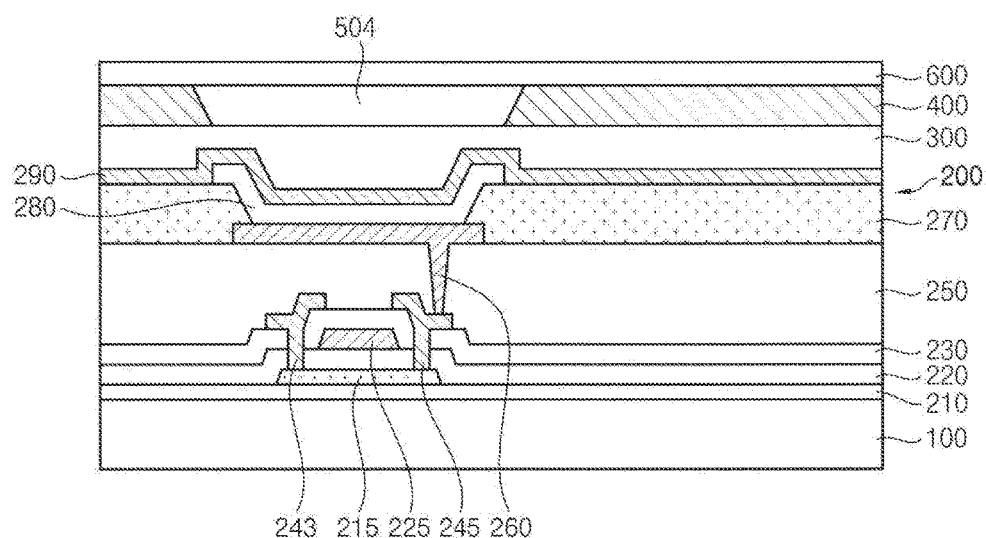
FIG. 13 is an enlarged view of region B of FIG. 12.

FIG. 12 is a cross-sectional view illustrating a mirror display apparatus in accordance with exemplary embodiments. FIG. 13 is an enlarged view of region B of FIG. 12. The mirror display apparatus of FIGS. 12 and 13 may have structures and/or constructions substantially the same as or similar to those of the mirror display apparatus of FIGS. 1 and 2 except for an arrangement of a refractive index matching layer. The same or like elements shown in FIGS. 12 and 13 have been labeled with the same reference characters as used above to describe the exemplary embodiments of the mirror display apparatus shown in FIGS. 1 and 2, and any repetitive detailed descriptions thereof will hereinafter be omitted or simplified.

Referring to FIGS. 12 and 13, an exemplary embodiment of a mirror display apparatus 12 may include a display unit 200 disposed on a substrate 100, a thin film encapsulation layer 300 continuously extending on a surface of the display unit 200, a plurality of mirror patterns 400 disposed on the thin film encapsulation layer 300, a refractive index matching layer 504 filling regions between neighboring ones of the mirror patterns 400 and a protection layer 600 disposed on the refractive index matching layer 504.

The substrate 100 may include, e.g., a glass substrate, a transparent plastic substrate or a flexible plastic substrate. The substrate 100 may support the display unit 200, etc.

The display unit 200 may include a switching device on the substrate 100 and a display structure electrically connected to the switching device.

The switching device may include, e.g., a TFT including an active pattern 215, a gate insulation layer 220, a gate electrode 225, a source electrode 243 and a drain electrode 245. The display structure may include, e.g., a first electrode 260, a display layer 280 and the second electrode 290.

The thin film encapsulation layer 300 may seal the display unit 200 to protect the display unit 200. In one exemplary embodiment, for example, the thin film encapsulation layer 300 may extend continuously on the surface of the display unit 200.

The thin film encapsulation layer 300 may include at least one inorganic layer and at least one organic layer (not shown) that are sequentially stacked. For example, the thin film encapsulation layer 300 may include organics layers and inorganic layers repeatedly stacked on each other. Alternatively, the thin film encapsulation layer 300 may include a plurality of organic layers (not shown). Alternatively, the thin film encapsulation layer 300 may include a plurality of or inorganic layers (not shown). Alternatively, the thin film encapsulation layer 300 may include the organics layers and the inorganic layers repeatedly stacked one on another.

A refractive index of the thin film encapsulation layer 300 may be greater than a refractive index of the refractive index matching layer 504 as described above. For example, when the thin film encapsulation layer 300 includes a plurality of layers, a refractive index of an uppermost layer of the thin film encapsulation layer 300 may be greater than the refractive index of the refractive index matching layer 504.

The mirror patterns 400 may be disposed or arranged on the thin film encapsulation layer 300. In one exemplary embodiment, for example, the mirror patterns 400 may be in, e.g., a grid shape, a line shape, a mesh shape, or a plurality of islands shape.

The refractive index matching layer 504 may fill regions between neighboring ones of the mirror patterns 400.

In one exemplary embodiment, for example, the refractive index matching layer 504 may not be disposed on top surfaces of the mirror patterns 400, and the refractive index matching layer 504 may be disposed on side surfaces of the mirror patterns 400 and a top surface of the thin film encapsulation layer 300. In such an embodiment, the refractive index matching layer 504 may cover the side surfaces of the mirror patterns 400 and the top surface of the thin film encapsulation layer 300 exposed by the mirror patterns 400. In such an embodiment, the refractive index matching layer 504 may have substantially the same thickness as the mirror patterns 400

In exemplary embodiments, the refractive index matching layer 504 may include an adhesive material.

The refractive index of the refractive index matching layer 504 may be less than the refractive index of the thin film encapsulation layer 300 and may be greater than a refractive index of the protection layer 600 as described above.

In one exemplary embodiment, for example, the refractive index matching layer 504 may include an acryl or a silicon.

The protection layer 600 may be disposed on the refractive index matching layer 504. In such an embodiment, the refractive index of the protection layer 600 may be less than the refractive index of the refractive index matching layer 504. For example, when the protection layer 600 includes a plurality of layers, a refractive index of a lowermost layer of the protection layer 600 may be less than the refractive index of the refractive index matching layer 504. In one exemplary embodiment, for example, the protection layer 600 may include a glass or a polymer film.

The mirror display apparatus 12 in accordance with exemplary embodiments includes the refractive index matching layer 504 filling regions between neighboring ones of mirror patterns 400. The refractive index of the refractive index matching layer 504 may be less than the refractive index of the thin film encapsulation layer 300 and may be greater than a refractive index of the protection layer 600.

Accordingly, in such embodiment, a gap at the regions between neighboring ones of the mirror patterns 400, which is typically filled with air in a conventional mirror display apparatus, may be filled with the refractive index matching layer 504, such that a light emitting efficiency of the mirror display apparatus 12 may be enhanced.

In such embodiments, because the refractive index matching layer 504 may not be disposed on the top surfaces of the mirror patterns 400, a production cost may decrease and a slim mirror display apparatus may be implemented.

FIGS. 14 to 18 are cross-sectional views illustrating a method of manufacturing a mirror display apparatus in accordance with exemplary embodiments. The processes and materials of the method shown in FIGS. 14 to 18 are substantially the same as or similar to those described with reference to FIGS. 3 to 6 except that a refractive index matching layer is not disposed on top surfaces of the mirror patterns. The same or like elements shown in FIGS. 14 to 18 have been labeled with the same reference characters as used above to describe the exemplary embodiments of the method shown in FIGS. 3 to 6, and any repetitive detailed description thereof will hereinafter be omitted or simplified.

Figure 14:
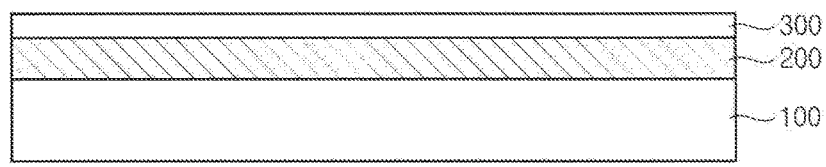
FIGS. 14 to 18 are cross-sectional views illustrating a method of manufacturing a mirror display apparatus in accordance with exemplary embodiments.

Referring to FIGS. 14 and 13, a display unit 200 and a thin film encapsulation layer 300 extending continuously on a surface of the display unit 200 may be provided or formed on a substrate 200

The substrate 100 may include a glass substrate, a transparent plastic substrate, or a flexible plastic substrate. The substrate 100 may support the display unit 200, etc.

The display unit 200 may include a switching element formed on the substrate 100 and a display structure electrically connected to the switching element.

The thin film encapsulation layer 300 may be formed to seal the display unit 200 and to protect the display unit 200. In one exemplary embodiment, for example, the thin film encapsulation layer 300 may be formed to extend continuously on the surface of the display unit 200.

A refractive index of the thin film encapsulation layer 300 may be greater than a refractive index of the refractive index matching layer 504 as described above. For example, when the thin film encapsulation layer 300 includes a plurality of layers, a refractive index of an uppermost layer of the thin film encapsulation layer 300 may be greater than the refractive index of the refractive index matching layer 504.

Figure 15:
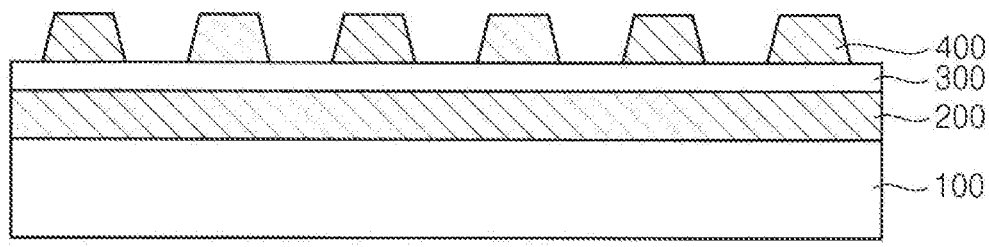

Referring to FIG. 15, a plurality of mirror patterns 400 may be provided or formed on the thin film encapsulation layer 300.

In one exemplary embodiment, for example, a metal layer (not shown) may be formed on the thin film encapsulation layer 300. The metal layer may be patterned to form the mirror patterns 400.

In one exemplary embodiment, for example, the mirror patterns 400 may be formed in a grid arrangement, a mesh arrangement or an arrangement including a plurality of islands through the thin film encapsulation layer 300.

Figure 16:
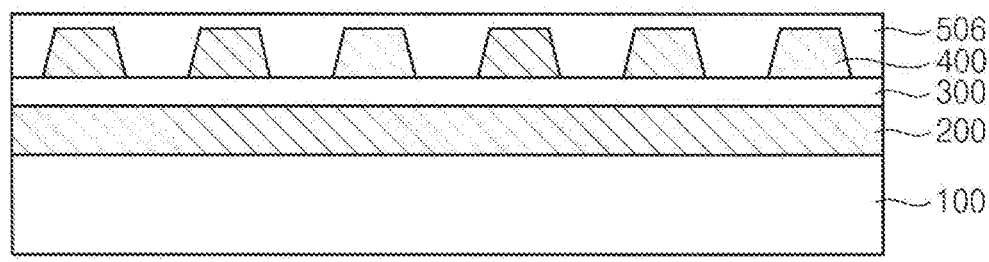
Figure 17:
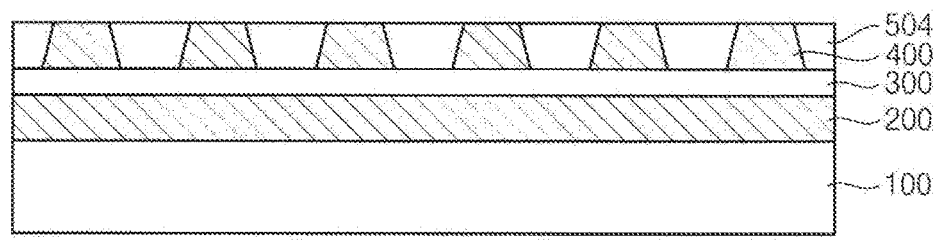

Referring to FIGS. 16 and 17, a refractive index matching layer 504 may be provided or formed to fill regions between neighboring ones of the mirror patterns 400.

In such an embodiment, a preliminary refractive index matching layer 506 may be formed to sufficiently fill the regions between neighboring ones of the mirror patterns 400, and may be planarized until top surfaces of the mirror patterns 400 may be exposed to the form the refractive index matching layer 504.

In one exemplary embodiment, for example, the planarization process may be performed by a chemical mechanical polishing ("CMP").

In such an embodiment, a refractive index of the refractive index matching layer 504 may be less than a refractive index of the thin film encapsulation layer 300 and may be greater than a refractive index of the protection layer 600.

Figure 18:
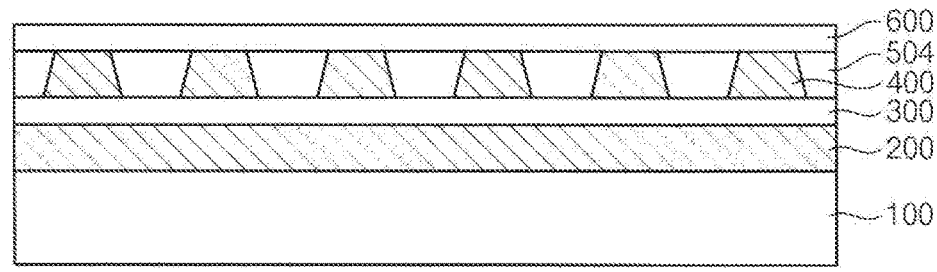

Referring to FIG. 18, the protection layer 600 may be provided or formed on the refractive index matching layer 504 and the mirror patterns 400.

The refractive index of the protection layer 600 may be less than the refractive index of the refractive index matching layer 504. For example, when the protection layer 600 includes a plurality of layers, a refractive index of a lowermost layer of the protection layer 600 may be less than the refractive index of the refractive index matching layer 504. In one exemplary embodiment, for example, the protection layer 600 may include a glass or a polymer film.

Figure 19:
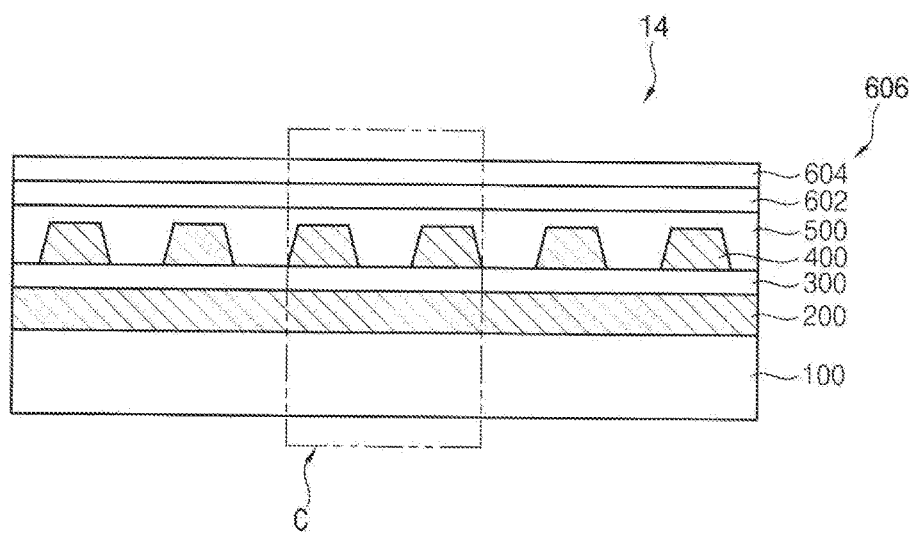
FIG. 19 is a cross-sectional view illustrating a mirror display apparatus in accordance with exemplary embodiments.
Figure 20:
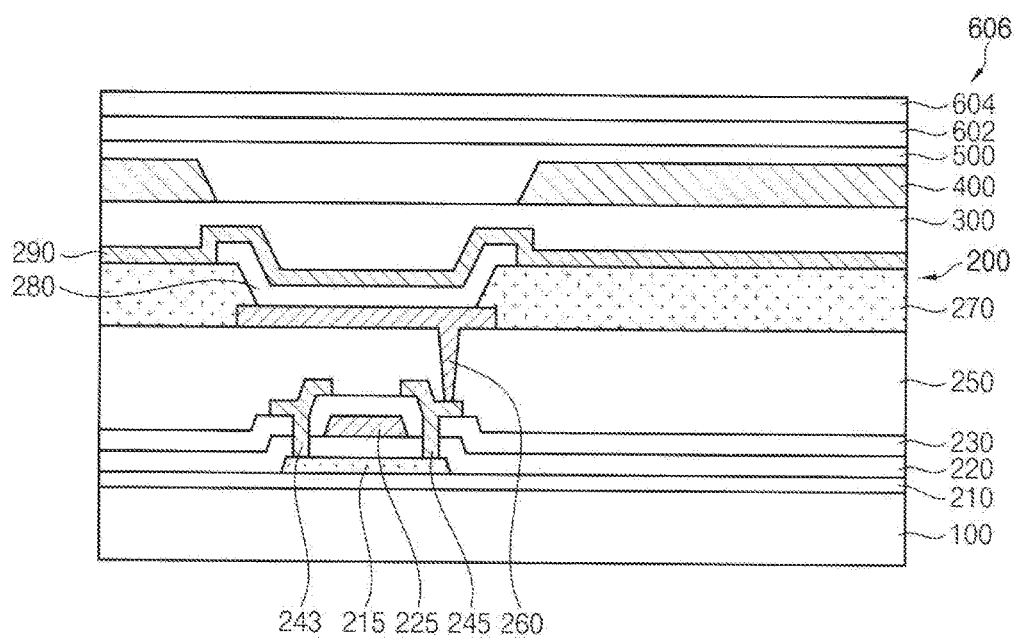
FIG. 20 is an enlarged view of region C of FIG. 19.

FIG. 19 is a cross-sectional view illustrating a mirror display apparatus in accordance with exemplary embodiments. FIG. 20 is an enlarged view of region C of FIG. 19. The mirror display apparatus of FIGS. 19 and 20 may have structures and/or constructions substantially the same as or similar to those of the mirror display apparatus of FIGS. 1 and 2 except for a protection layer. The same or like elements shown in FIGS. 19 and 20 have been labeled with the same reference characters as used above to describe the exemplary embodiments of the mirror display apparatus shown in FIGS. 1 and 2, and any repetitive detailed descriptions thereof will hereinafter be omitted or simplified.

Referring to FIGS. 19 and 20, an exemplary embodiment of a mirror display apparatus 14 may include a display unit 200 disposed or arranged on a substrate 100, a thin film encapsulation layer 300 continuously extending on a surface of the display unit 200, a plurality of mirror patterns 400 disposed or arranged on the thin film encapsulation layer 300, a refractive index matching layer 500 filling regions between neighboring ones of the mirror patterns 400 and a protection layer 606 disposed on the refractive index matching layer 500.

The substrate 100 may include, e.g., a glass substrate, a transparent plastic substrate or a flexible plastic substrate. The substrate 100 may support the display unit 200, etc.

The display unit 200 may include a switching device on the substrate 100 and a display structure electrically connected to the switching device.

The thin film encapsulation layer 300 may seal the display unit 200 to protect the display unit 200. In one exemplary embodiment, for example, the thin film encapsulation layer 300 may extend continuously on the surface of the display unit 200.

A refractive index of the thin film encapsulation layer 300 may be greater than a refractive index of the refractive index matching layer 500 as described above. For example, when the thin film encapsulation layer 300 includes a plurality of layers, a refractive index of an uppermost layer of the thin film encapsulation layer 300 may be greater than the refractive index of the refractive index matching layer 504.

The mirror patterns 400 may be disposed or arranged on the thin film encapsulation layer 300. In one exemplary embodiment, for example, the mirror patterns 400 may be in, e.g., a grid shape, a line shape, a mesh shape, or a plurality of islands shape.

The refractive index matching layer 500 may fill regions between neighboring ones of the mirror patterns 400.

In one exemplary embodiment, for example, the refractive index matching layer 500 may be disposed on surfaces of the mirror patterns 400 and a top surface of the thin film encapsulation layer 300. In such an embodiment, the refractive index matching layer 500 may cover the mirror patterns 400 and the top surface of the thin film encapsulation layer 300 exposed by the mirror patterns 400.

The refractive index of the refractive index matching layer 500 may be less than the refractive index of the thin film encapsulation layer 300 and may be greater than a refractive index of the protection layer 606 as described above. For example, when the thin film encapsulation layer 300 includes a plurality of layers, the refractive index of the refractive index matching layer 500 may be less than a refractive index of an uppermost layer of the thin film encapsulation layer 300. For example, when the protection layer 606 includes a plurality of layers, the refractive index of the refractive index matching layer 500 may be greater than a refractive index of a lowermost layer of the protection layer 606.

The protection layer 606 may be disposed on the refractive index matching layer 500. The protection layer 606 may include first and second protection layers 602 and 604 sequentially stacked on the refractive index matching layer 500. As described above, the refractive index of the refractive index matching layer 500 may be greater than a refractive index of the first protection layer 602 (e.g., the lowermost layer) that is nearest to the refractive index matching layer 500.

In one exemplary embodiment, for example, the first protection layer 602 may include a glass, and the second protection layer 604 may include a polymer film. Alternatively, the first protection layer 602 may include the polymer film, and the second protection layer 604 may include a glass.

The mirror display apparatus 14 in accordance with exemplary embodiments includes the refractive index matching layer 500 filling regions between neighboring ones of mirror patterns 400. The refractive index of the refractive index matching layer 500 may be less than the refractive index of the thin film encapsulation layer 300 and may be greater than a refractive index of the protection layer 606.

Accordingly, in such embodiments, a gap at the regions between neighboring ones of the mirror patterns 400, which is typically filled with air in a conventional mirror display apparatus, may be filled with the refractive index matching layer 500, such that a light emitting efficiency of the mirror display apparatus 14 may be enhanced.

In such an embodiment, where the protection layer 505 includes the first and second protection layers 602 and 604, the display unit 200, the thin film encapsulation layer 300, the mirror patterns 400 and the refractive index matching layer 500 may be efficiently protected.

Figure 21:
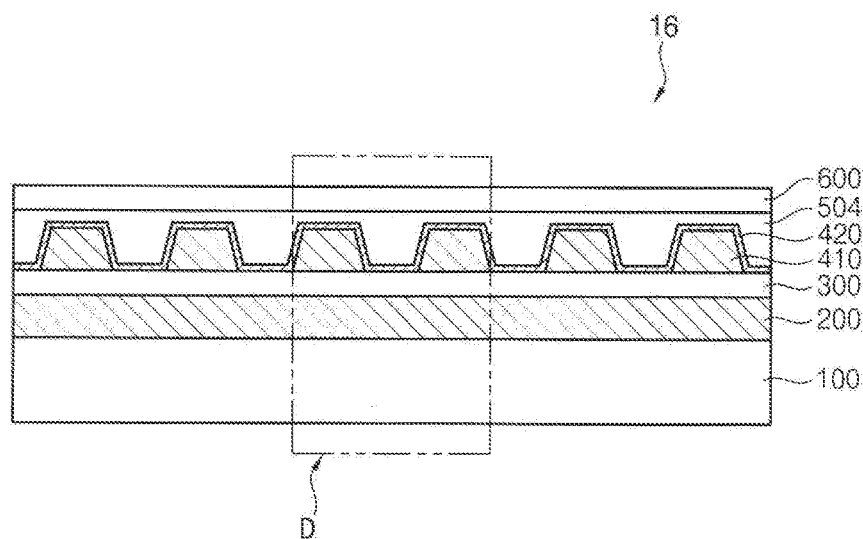
FIG. 21 is a cross-sectional view illustrating a mirror display apparatus in accordance with exemplary embodiments.
Figure 22:
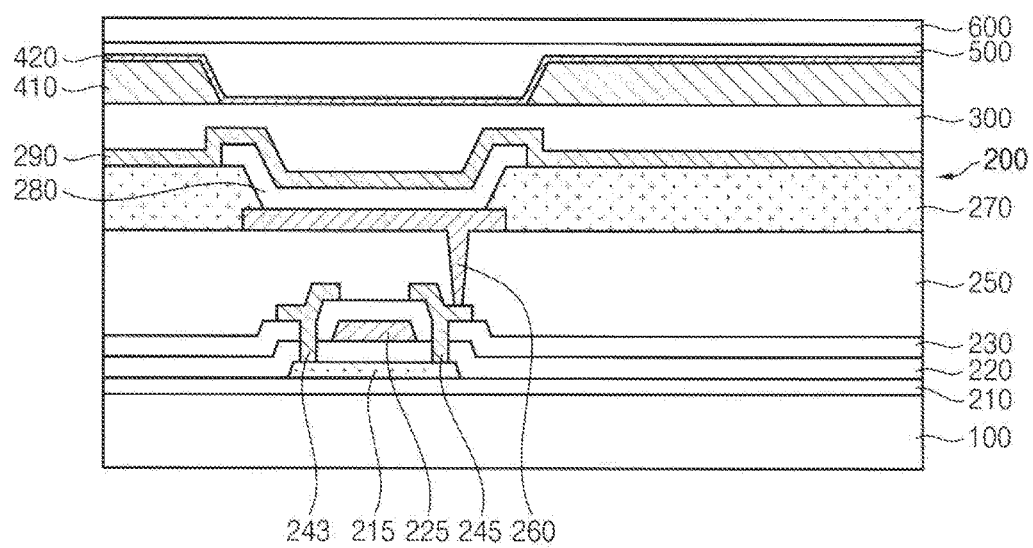
FIG. 22 is an enlarged view of region D of FIG. 21.

FIG. 21 is a cross-sectional view illustrating a mirror display apparatus in accordance with exemplary embodiments. FIG. 22 is an enlarged view of region D of FIG. 21. The mirror display apparatus of FIGS. 21 and 22 may have structures and/or constructions substantially the same as or similar to those of the mirror display apparatus of FIGS. 1 and 2 except for a mirror layer. The same or like elements shown in FIGS. 21 and 22 have been labeled with the same reference characters as used above to describe the exemplary embodiments of the mirror display apparatus shown in FIGS. 1 and 2, and any repetitive detailed descriptions thereof will hereinafter be omitted or simplified.

Referring to FIGS. 21 and 22, an exemplary embodiment of a mirror display apparatus 16 may include a display unit 200 disposed or arranged on a substrate 100, a thin film encapsulation layer 300 continuously extending on a surface of the display unit 200, a plurality of mirror patterns 410 disposed or arranged on the thin film encapsulation layer 300, a mirror layer 420 stacked on the thin film encapsulation layer 300 and the mirror patterns 410, a refractive index matching layer 500 filling regions between neighboring ones of the mirror patterns 400 and a protection layer 600 disposed on the refractive index matching layer 500.

The substrate 100 may include, e.g., a glass substrate, a transparent plastic substrate or a flexible plastic substrate. The substrate 100 may support the display unit 200, etc.

The display unit 200 may include a switching device on the substrate 100 and a display structure electrically connected to the switching device.

The thin film encapsulation layer 300 may seal the display unit 200 to protect the display unit 200. In one exemplary embodiment, for example, the thin film encapsulation layer 300 may extend continuously on the surface of the display unit 200.

A refractive index of the thin film encapsulation layer 300 may be greater than a refractive index of the refractive index matching layer 500 as described above. For example, when the thin film encapsulation layer 300 includes a plurality of layers, a refractive index of an uppermost layer of the thin film encapsulation layer 300 may be greater than the refractive index of the refractive index matching layer 500.

The mirror patterns 410 may be disposed or arranged on the thin film encapsulation layer 300. In one exemplary embodiment, for example, the mirror patterns 410 may be in, e.g., a grid shape, a line shape, a mesh shape, or a plurality of islands shape.

The mirror layer 420 may be disposed on surfaces of the mirror patterns 410 and a top surface of the thin film encapsulation layer 300 exposed by the mirror patterns 410.

The mirror layer 420 may make a contact with the surfaces of the mirror patterns 410 and the top surface of the thin film encapsulation layer 300. The mirror layer 420 may include a material having a high reflectivity. The mirror layer 420 may include a metal. For example, the mirror layer 420 may be a transflective layer.

In one exemplary embodiment, for example, the mirror layer 420 may include at least one metal selected from aluminum (Al), chromium (Cr), copper (Cu), silver (Ag), titanium (Ti), tantalum (Ta), molybdenum (Mo) and tungsten (W).

The mirror layer 420 may have a double-layer structure. Alternatively, the mirror layer 420 may have a triple-layer structure or a quadruple-layer structure. In some embodiments, the reflectivity of the mirror layer 420 may be less than the reflectivity of the mirror pattern 410.

The refractive index matching layer 500 may fill regions between neighboring ones of the mirror patterns 410. In one exemplary embodiment, for example, the refractive index matching layer 500 may be disposed on the surfaces of the mirror patterns 410 and a top surface of the thin film encapsulation layer 300. In such an embodiment, the refractive index matching layer 500 may be disposed on the mirror layer 420.

The refractive index of the refractive index matching layer 500 may be less than the refractive index of the thin film encapsulation layer 300 and may be greater than a refractive index of the protection layer 600 as described above.

The protection layer 600 may be disposed on the refractive index matching layer 500. In such an embodiment, the refractive index of the protection layer 600 may be less than the refractive index of the refractive index matching layer 500. For example, when the protection layer 600 includes a plurality of layers, a refractive index of a lowermost layer of the protection layer 600 may be less than the refractive index of the refractive index matching layer 500.

The protection layer 600 may include a glass or a polymer film.

The mirror display apparatus 16 in accordance with exemplary embodiments includes the refractive index matching layer 500 filling regions between neighboring ones of mirror patterns 410. In such embodiment, the refractive index of the refractive index matching layer 500 may be less than the refractive index of the thin film encapsulation layer 300 and may be greater than a refractive index of the protection layer 600.

Accordingly, in such embodiments, a gap at the regions between neighboring ones of the mirror patterns 410, which is typically filled with air in a conventional mirror display apparatus, may be filed with the refractive index matching layer 500, such that a light emitting efficiency of the mirror display apparatus 16 may be enhanced.

In such embodiment, due to the mirror layer 420, a mirror quality and a display quality of the display apparatus may be enhanced.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A mirror display apparatus comprising:
a display unit disposed on a substrate;
a thin film encapsulation layer extending continuously on a surface of the display unit;
a plurality of mirror patterns disposed on the thin film encapsulation layer;
a protection layer disposed on the mirror patterns; and
a refractive index matching layer in direct contact with the protection layer and interposed between the thin film encapsulation layer and the protection layer, wherein regions between neighboring ones of the mirror patterns are filled with the refractive index matching layer, wherein
a refractive index of the refractive index matching layer is less than a refractive index of the thin film encapsulation layer, and
the refractive index of the refractive index matching layer is greater than a refractive index of the protection layer.

2. The mirror display apparatus of claim 1, wherein the refractive index matching layer comprises an acrylic or a silicon.

3. The mirror display apparatus of claim 1, wherein the protection layer comprises a glass or a polymer film.

4. The mirror display apparatus of claim 1, wherein
the protection layer includes first and second protection layers, which are sequentially disposed on the surfaces of the mirror patterns, and
the refractive index of the refractive index matching layer is greater than a refractive index of the first protection layer.

5. The mirror display apparatus of claim 4, wherein
the first protection layer comprises a glass, and
the second protection layer comprises a polymer film.

6. The mirror display apparatus of claim 1, wherein the refractive index matching layer is disposed on the surfaces of the mirror patterns and on a top surface of the thin film encapsulation layer exposed by the mirror patterns.

7. The mirror display apparatus of claim 1, wherein the refractive index matching layer comprises an adhesive material.

8. The mirror display apparatus of claim 1, wherein
the thin film encapsulation layer comprises at least one inorganic layer and at least one organic layer, and
a refractive index of the refractive index matching layer is less than a refractive index of an uppermost layer of the thin film encapsulation layer.

9. The mirror display apparatus of claim 1, wherein
the thin film encapsulation layer comprises a plurality of inorganic layers or a plurality of organic layers, and
a refractive index of the refractive index matching layer is less than a refractive index of an uppermost inorganic layer or an uppermost organic layer.

10. The mirror display of claim 1, wherein the protection layer is disposed on surfaces of the mirror patterns.

11. A mirror display apparatus comprising:
a display unit disposed on a substrate;
a thin film encapsulation layer extending continuously on a surface of the display unit;
a plurality of mirror patterns disposed on the thin film encapsulation layer;
a protection layer disposed on the mirror patterns; and
a refractive index matching layer interposed between the thin film encapsulation layer and the protection layer, wherein regions between neighboring ones of the mirror patterns are filled with the refractive index matching layer,
wherein
a refractive index of the refractive index matching layer is less than a refractive index of the thin film encapsulation layer, and
the refractive index of the refractive index matching layer is greater than a refractive index of the protection layer,
wherein
the display unit includes an emitting region and a non-emitting region,
the emitting region overlaps a portion of the refractive index matching layer between the neighboring ones of the mirror patterns, and
the non-emitting region overlaps the mirror patterns.

12. The mirror display of claim 11, wherein the protection layer is disposed on surfaces of the mirror patterns.

* * * * *